United States Patent [19]

Endo

[11] Patent Number: 5,227,766
[45] Date of Patent: Jul. 13, 1993

[54] ABNORMALITY DETECTING SYSTEM
[75] Inventor: Yoshimi Endo, Tokyo, Japan
[73] Assignee: Oki Electric Industry Co., Ltd., Tokyo, Japan
[21] Appl. No.: 662,460
[22] Filed: Feb. 28, 1991
[30] Foreign Application Priority Data
  Mar. 13, 1990 [JP] Japan .................................. 2-059838
[51] Int. Cl.⁵ .............................................. G08B 21/00
[52] U.S. Cl. ...................................... 340/635; 340/438; 340/439; 73/116; 364/424.03
[58] Field of Search ............... 340/635, 439, 438, 901, 340/902; 364/424.03, 424.04, 431.01; 73/116

[56] References Cited
U.S. PATENT DOCUMENTS

| | | | |
|---|---|---|---|
| 4,019,489 | 4/1977 | Cartmill | 340/426 |
| 4,587,838 | 5/1986 | Sakai et al. | 73/116 |
| 4,706,086 | 11/1987 | Panizza | 340/902 |
| 4,831,560 | 5/1989 | Zaleski | 73/116 |

Primary Examiner—Jin F. Ng
Assistant Examiner—Jeffery A. Hofsass
Attorney, Agent, or Firm—Spencer, Frank & Schneider

[57] ABSTRACT

An abnormality detecting system includes equipment for detecting an abnormality which occurs therein and for transmitting an abnormal signal, and an abnormal signal processing unit for analyzing the abnormal signal received from the electric equipment. The abnormal signal processing unit is formed in a portable shape, and receives an abnormal signal from the electric equipment in a non-contact manner by means of radiowaves or infrared rays. The abnormal signal processing unit stores beforehand data relating to abnormalities and data corresponding to the received abnormal signal can be extracted and displayed. Further, the abnormal signal processing unit can transmit the received abnormal signal to an external component by means of radiowaves or infrared rays.

11 Claims, 4 Drawing Sheets

ABNORMALITY DETECTING SYSTEM

BACKGROUND OF THE INVENTION

1. Field of the Invention

The present invention relates to a system for detecting an abnormality in an electric equipment installed on transporting means such as vehicles, ships and aircraft.

In general, electric equipment such as an engine control unit installed on an automobile incorporates an abnormality detecting section for detecting an abnormality which has occurred in the electric equipment.

When an abnormality occurs in the electric equipment, the abnormality detecting section transmits an abnormal signal to a display section in the electric equipment and a display panel on the dashboard of an automobile.

This abnormal signal is a signal indicating the content of an abnormality (what kind of abnormality has occurred in what position in the electric equipment).

The display panel on the dashboard lights up in accordance with the abnormal signal, while the display section in the electric equipment lights up to indicate the content of the abnormality in accordance with the abnormal signal.

An inspector can know that an abnormality has occurred in the electric equipment and understand what kind of abnormality has occurred.

These years, circuits arranged in electric equipment installed on an automobile have become more and more complicated, and accordingly, various abnormalities have occurred in such equipment.

The display section of an electric equipment displays the contents of several kinds of abnormalities by coding the content of an abnormality in accordance with an abnormality signal.

Further, when a plurality of abnormalities occur, the display section simultaneously displays a plurality of codes.

Accordingly, an inspector can know the contents of the abnormalities by reading codes on the display section.

However, the display section incorporated in the electric equipment may be installed at a place where it is difficult to read the display.

Further, it takes a long time for an inspector to understand the coded content of an abnormality.

Further, the above-mentioned electric equipment has terminals for outputting abnormal signals to an external device. The inspector can analyze in detail of the content of the abnormality using an analyzer connected to the terminals.

However, in this case, there have been the following problems: First, it takes a long time to connect an analyzer to the electric equipment. Second inferior contacts may occur in the connection between the analyzer and the connecting terminals. Further, an extra space should be provided for the connection.

SUMMARY OF THE INVENTION

The present invention is devised to solve the above-mentioned problems, and accordingly, an object of the present invention is to provide an abnormality detecting system by which the content of an abnormality that occurs in an electric equipment can be easily recognized in a short time.

Another object of the present invention is to provide an abnormality detecting system which can analyze in detail the content of an abnormality while preventing an inferior connection between the analyzer and the terminal which has an extra space for making the connection.

A further object of the present invention is to provide an abnormality detecting system by which the content of an abnormality can be precisely recognized, and a troubleshooting method can be suitably provided.

According to the present invention, there is provided an abnormal detecting system comprising:

an electric equipment for detecting an abnormality occurred therein so as to transmit an abnormal signal indicating the content of the abnormality; and an abnormal signal processing unit including:

a signal receiving section receiving the abnormal signal;

a first memory section storing therein the received abnormal signal;

a second memory section for storing beforehand therein predetermined data corresponding to abnormal signals transmitting from the electric equipment;

a judging section for detecting data corresponding to the abnormal signal stored in the first memory section, among the data stored in the second memory section;

a display section for indicating the data detected by the judging section;

a manipulating section for instructing operation within the abnormal signal processing unit; and a processing section for executing the operation in accordance with an instruction from the manipulating section.

DESCRIPTION OF THE PREFERRED EMBODIMENTS

Explanation will be made of an arrangement which executes the present invention with reference to the accompanying drawings.

Figure 1:
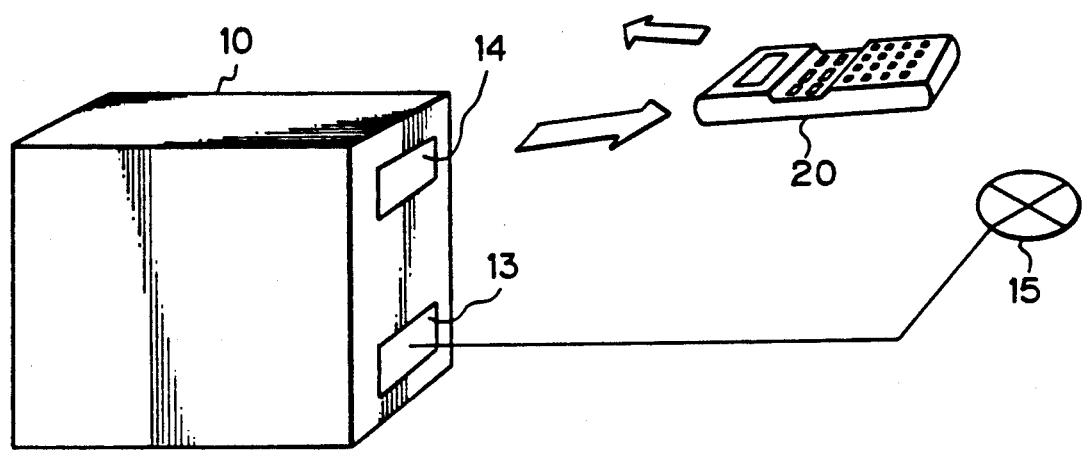
FIG. 1 is a schematic view illustrating an abnormality detecting system according to the present invention.

FIG. 1 is a schematic view illustrating an embodiment of an abnormality detecting system according to the present invention.

This abnormality detecting system comprises an electric equipment 10 installed, for example, on an automobile, and an abnormal signal processing unit 20.

The electric equipment 10 is an engine control unit, a transmission control unit or the like, and transmits an abnormal signal indicating the contents of an abnormality which occurs in, for example, an electronic circuit incorporated in the electric equipment, to the abnormal signal processing unit 20 by means of radiowaves or infrared rays.

The abnormal signal processing unit 20 is formed in a shape and a size which give suitable portability, and is adapted to receive the above-mentioned abnormal signal under a non-contact condition, and to analyze the content of the abnormality in order to display the analyzed result and other necessary data.

Figure 2:
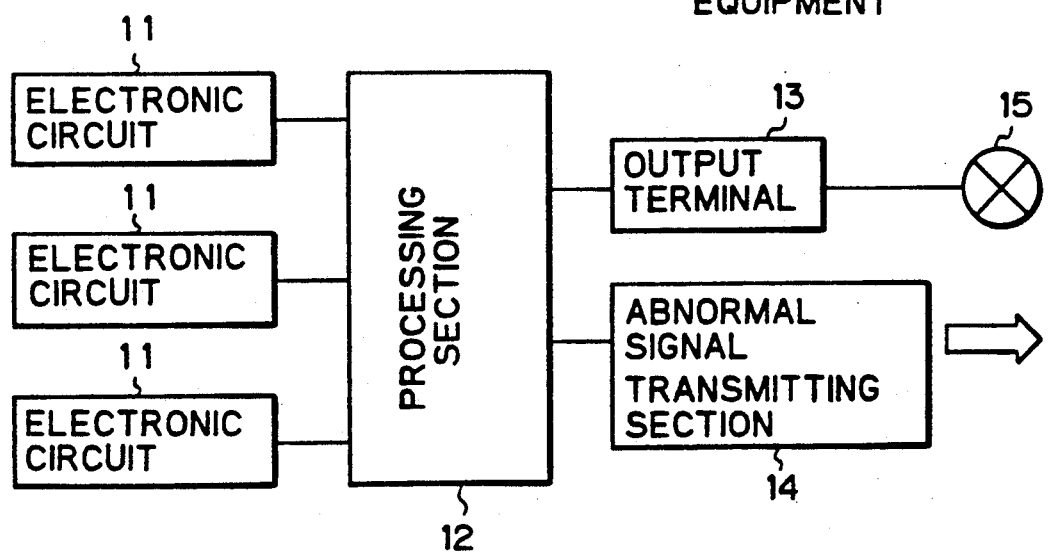
FIG. 2 is a block diagram illustrating a circuit arrangement of an electric equipment.
Figure 3:
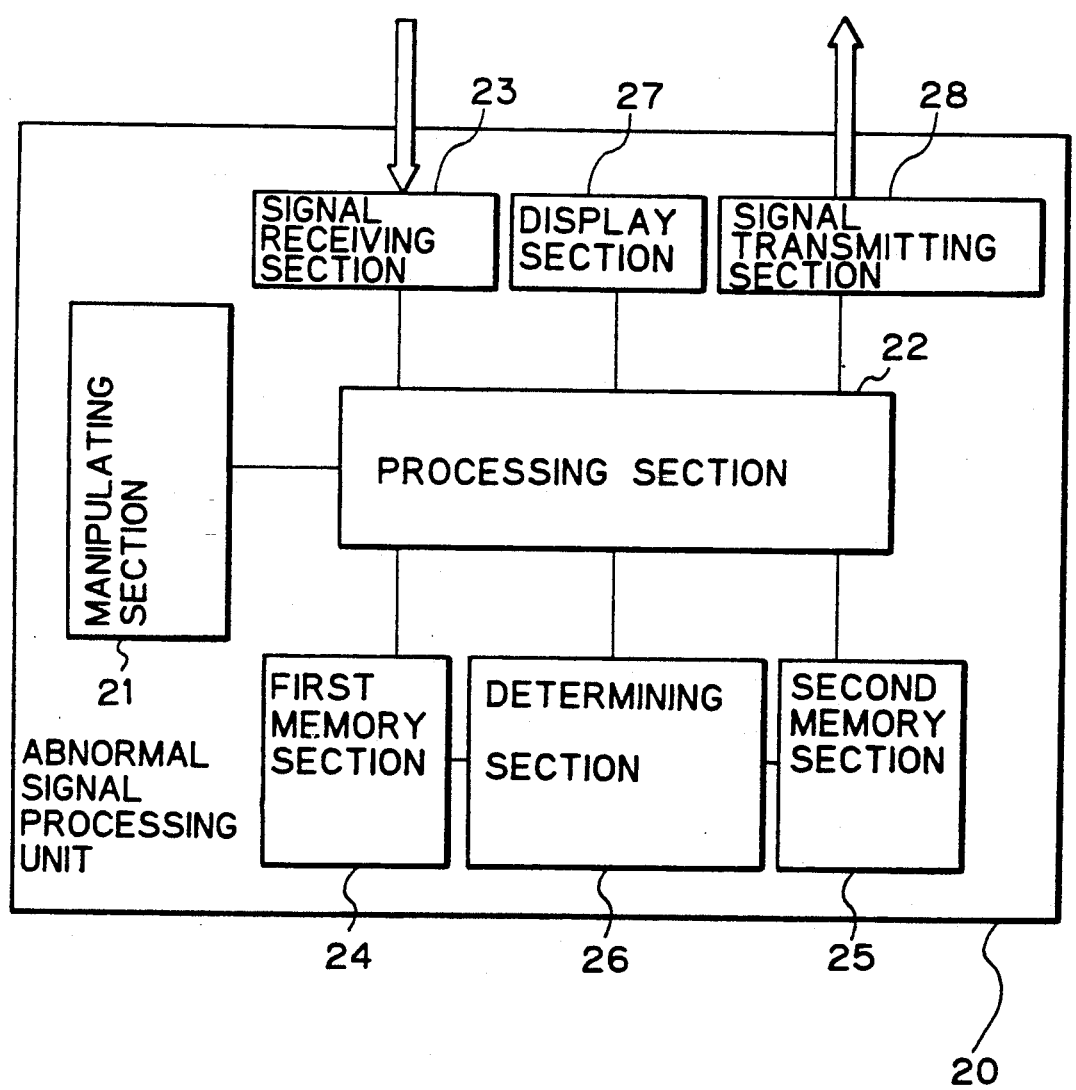
FIG. 3 is a block diagram illustrating a circuit arrangement of an abnormal signal processing unit.

FIG. 2 is a block diagram illustrating the circuit arrangement of the electric equipment 10, and FIG. 3 is a block diagram view illustrating the circuit arrangement of the abnormal signal processing unit.

The arrangement according to the present invention will be described with in reference to these figures.

Referring to FIG. 2, the electric equipment 10 comprises a plurality of electronic circuits 11, a processing section 12, an output terminal 13, and an abnormal signal transmitting section 14.

These electronic circuits 11 are incorporated in the electric equipment 10 which therefore can perform its inherent functions.

The present invention is devised so as to accurately convey the content of an abnormality which occurs in, for example, one of these electronic circuits 11.

The processing section 12 carries out several signal processes within the electric equipment 10, and detects an abnormality occurring in the electric equipment 10 so as to transmit an abnormal signal indicating the content of the abnormality (e.g., the location the abnormality and the kind of abnormality) to the output terminal 13 and the abnormality signal transmitting section 14. The output terminal 13 is connected to a display panel 15 provided on the dashboard of an automobile.

The display panel 15 lights up to display an occurrence of an abnormality in the electric equipment 10 in accordance with the abnormal signal which is received through the output terminal 13.

The abnormal signal transmitting section 14 transmits the above-mentioned abnormal signal to an external device by means of radiowaves or infrared rays.

Referring to FIG. 3, the abnormal signal processing unit 20 comprises a manipulating section 21, a processing section 22, a signal receiving section 23, a first memory section 24, a second memory section 25, a judging or determining section 26, a display section 27 and a signal transmitting section 28.

The manipulating section 21 instructs all processes within the abnormal signal processing unit 20.

The processing section 22 controls all processes within the abnormal signal processing unit 20 in accordance with an instruction from the manipulating section 21.

The signal receiving section 23 receives an abnormal signal transmitted from the transmitting section 14 in the electric equipment 10, and delivers the signal to the processing section 22.

The first memory section 24 stores therein the abnormal signal received through the signal receiving section 23.

The second memory section 25 stores beforehand data (that is, information relating to abnormalities, troubleshooting methods) relating to abnormalities which might occur in the electric equipment 10.

The judging or determination section 26 extracts data corresponding to the abnormality stored in the first memory section 24, among the data stored in the second memory section 25.

The display section 27 displays thereon the content of the received abnormal signal or data relating to the abnormality extracted by the judging section 26, in accordance with an instruction from the manipulating section 21.

The signal transmitting section 28 transmits the abnormal signal stored in the first memory section 24 to an external device in accordance with an instruction from the manipulating section 21 by means of radiowaves or infrared rays.

Figure 4:
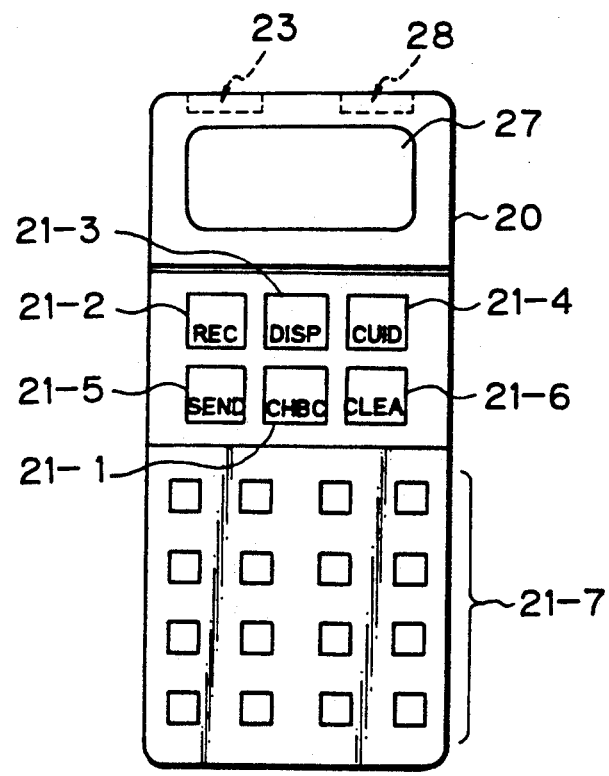
FIG. 4 is a view illustrating the external appearance of the abnormal signal processing unit.

FIG. 4 is a view illustrating the external appearance of the abnormal signal processing unit 20.

The manipulating section 21 includes a plurality of manipulating keys.

A check key 21-1 is used for receiving an abnormal signal at the signal receiving section 23.

A memory key 21-2 is used for storing the received abnormal signal in the first memory section 24 and for displaying the content of the abnormal signal on the display section 27.

A display key 21-3 is used for changing over the contents of abnormal signals to be displayed on the display section 27 if a plurality of abnormal spots exist in the electric equipment.

A guide key 21-4 is used for displaying information relating to an abnormality and a troubleshooting method, in accordance with data stored in the second memory section 25.

A transmitting key 21-5 is used for transmitting the abnormal signal stored in the first memory section 24 to an external device through the signal transmitting section 28.

A clear key 21-6 is used for erasing the abnormal signal stored in the first memory section 24.

An auxiliary key 21-7 includes a plurality of code input keys, and is used for inputting other auxiliary data.

The abnormal signal processing unit 20 reads out data corresponding to a predetermined code inputted by manipulating the auxiliary key 21-7 from the second memory section 25, and displays the data on the display section 27.

The signal receiving section 23 receives abnormal signals by means of radiowaves and infrared rays in a non-contact condition.

The signal transmitting section 28 transmits abnormal signals by means of radiowaves and infrared rays in a non-contact condition.

The display section 27 includes an LCD (liquid crystal display) or the like to display characters and patterns.

Next explanation will be made of a specific operation of the abnormality detecting system according to the present invention.

When the processing section 12 in the electric equipment 10 detects an abnormality it transmits an abnormal signal to the display panel 15 on the dashboard through the output terminal 13 and the abnormal signal transmitting section 14.

Figure 5:
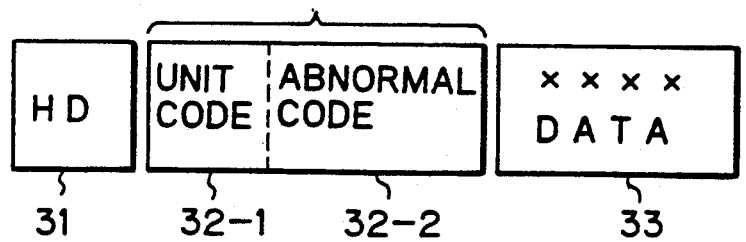
FIG. 5 is a view illustrating the structure of an abnormal signal.

FIG. 5 is a view illustrating a structure of the abnormal signal.

The abnormal signal 30 is composed of a header part 31, a unit part 32 consisting of a unit code 32-1 for indicating the name of the electric equipment 10 and a abnormal signal code 32-2 indicating the location of an abnormality, and a data part 33 indicating data relating to the abnormality.

When a plurality of abnormalities occurs simultaneously in the electric equipment 10, a plurality of abnormal signals 30 are transmitted successively and repeatedly at predetermined intervals.

The display panel 15 displays an abnormality in accordance with an abnormal signal.

Figure 6:
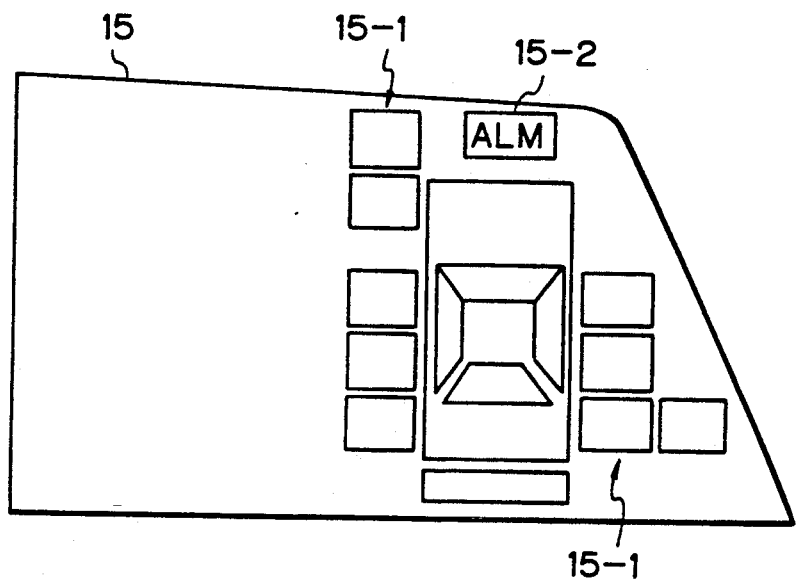
FIG. 6 is a view illustrating the arrangement of a display panel.

FIG. 6 is a view illustrating an example of the arrangement of the display panel 15.

Referring to FIG. 6, the display panel 15 incorporates warning lamps 15-1 for indicating a plurality of contents of warnings, and a warning lamp 15-2 for indicating the occurrence of an abnormality in the electric equipment 10.

The warning lamps 15-1 display, for example, an incomplete door closure of an automobile, a lack of fuel, turn-on conditions of electric lamps and the like.

The warning lamp 15-2 displays, for example, "ALM" to inform that a certain abnormality occurs in the electric equipment 10.

The abnormality signal transmitting section 1 continuously transmits an abnormal signal to an external device by means of radiowaves or infrared rays upon occurrence of an abnormality.

The inspector can accordingly know from the turned-on warning lamp 15-2 on the display panel 15 that a certain abnormality has occurred in the electric equipment 10.

However, the inspector cannot confirm a specific one among a plurality of electric equipments such as an engine control unit and a transmission control unit installed on an automobile only by this warning lamp 15-2.

Accordingly, the inspector directs the abnormal signal processing unit 20 to a position where it can receive a signal from the signal transmitting section 14 in one of the electric equipments 10 to successively check a plurality of the electric equipments 10 and to confirm what electric equipment 10 issues the abnormality.

The abnormal signal processing unit 20 operates in accordance with an instruction from the manipulating section 21 as follows.

The processing section 22 controls the signal receiving section 23 to receive an abnormal signal from the abnormal signal transmitting section 14 in a non-contact condition when the check key 21-1 is depressed.

The processing section 22 controls the display section 27 to display an indication "CHECK" which indicates that a abnormality occurs in the electric equipment 10 when it detects that the signal receiving section 23 receives the abnormal signal.

It is noted that if the abnormal signal processing unit 20 is opposed to an electric equipment 10 having no abnormality, no indication is displayed on the display section 27 since no abnormal signal is issued.

Figure 7A:
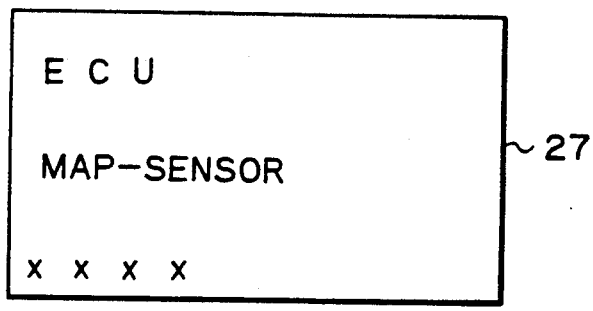
FIGS. 7(a) and 7(b) are views illustrating examples of displays on the display section.

FIG. 7(a) is a view illustrating an example of a display indicating an abnormal content on the display section 27.

In FIG. 7(a), the display section 27 gives information, that is, the unit code 32-1 indicating an electric equipment, an abnormal signal code 32-2 indicating the location of an abnormality, and a data section 33 indicating the abnormal data.

This display example shows that an abnormality has occurred in a manifold air pressure sensor (MAP sensor) in an engine control unit (ECU), and that an output value from the sensor is "✕ ✕ ✕ ✕". When the processing section 22 receives a plurality of abnormal signals, it controls so as to display only the content of a first one of a plurality of abnormal signals and to display successively the contents of the following abnormal signals by depressing the display key 21-3.

When the guide key 21-4 is depressed the processing section 22 controls the judging section 26 to extract data corresponding to a abnormal signal stored in the first memory section 24, among data stored in the second memory section 25 and controls to display the extracted data on the display section 27.

Figure 7B:
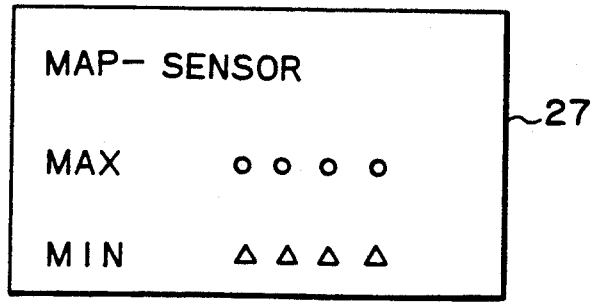

FIG. 7(b) is a view illustrating one display example in accordance with data stored in the second memory section 25.

This display example shows that an abnormality exists in a MAP sensor, and the normal value of the MAP sensor ranges from the upper limit "○○○○" to the lower limit "△△△△".

The second memory section 25 stores various kinds of information: data on abnormalities which may occur in the electric equipments 10 installed on an automobile, and data on troubleshooting methods.

Each time when the guide key 21-1 is depressed, the processing section 22 controls to extract various information relating to abnormal signals from the second memory section 25 successively and controls to display them on the display section 27.

Further, when the transmitting key 21-5 is depressed, the processing section 22 reads an abnormal signal stored in the first memory section 24 and transmits the abnormal signal to an external device (not shown) from the signal transmitting section 28 by means of radiowaves or infrared rays.

That is, when the inspector depresses the transmitting key 21-5 the abnormal signal can be transmitted to the external device (for example, an upper grade analyzer) in a non-contact condition.

The external device also has past operational historical information of the electric equipment 10 and an analysis with a higher accuracy can be carried out by referring to the information.

The processing section 22 erases the abnormal signal stored in the first memory section 24 when the clear key 21-6 is depressed.

However, in order to avoid erasing the signal upon erroneous manipulation, the section 22 can be designed so as to erase the abnormal signal only by depressing the clear-key by a predetermined cycle number.

As stated above, when the inspector depresses the keys in the manipulating section 21, successively, he can check what electric equipment issues an abnormality, confirm and analyze the content of the abnormality, and acquire other necessary information, and also erase an abnormal signal.

Further, the inspector can carry with him the abnormal signal processing unit 20, and transmit an abnormal signal received from the electric equipment to an external device, that is, the abnormal signal processing unit 20 can be used as a terminal unit for transmitting data, and accordingly, an analysis with a higher accuracy can be carried out.

Further, the auxiliary keys 21-7 are composed of a plurality of keys for inputting numerals, symbols and the like, and accordingly a code indicating a predictable abnormality can be inputted by means of these keys in combination.

The processing section 22 controls extraction of information on abnormalities and a troubleshooting method, corresponding to a predetermined code which is inputted by means of the auxiliary keys 21-7, and controls their display on the display section 27.

That is, the inspector can obtain information relating to a predictable abnormality except for abnormality detecting operation.

What we claim is:

1. An abnormality detecting system comprising:

electric equipment, said electric equipment including means for detecting an abnormality therein, and transmitting an abnormal signal indicative of the abnormality;

a display panel coupled to the electric equipment for receiving the abnormal signal and indicating that the abnormality occurred; and an abnormal signal processing unit separate from the electric equipment for receiving and analyzing the abnormal signal, said abnormal signal processing unit including:

a signal receiving section for receiving said abnormal signal;

a memory section for storing predetermined data corresponding to abnormalities in said electric equipment;

a judging section coupled to said signal receiving section and said memory section for extracting data corresponding to the abnormal signal from among the predetermined data stored in said memory section;

a display section coupled to said judging section for displaying the data extracted by said judging section;

a manipulating section for inputting instructions to be carried out in said abnormal signal processing unit; and a processing section coupled to said manipulating section for carrying out the instructions from said manipulating section.

2. An abnormality detecting system as set forth in claim 1, wherein said abnormal signal processing unit includes an additional memory section coupled to said signal receiving section for storing the abnormal signal, and a signal transmitting section for transmitting the abnormal signal stored in said additional memory section to an external device.

3. An abnormality detecting system as set forth in claim 1, wherein said abnormal signal processing unit is formed in a shape which is portable.

4. An abnormality detecting system as set forth in claim 1, wherein said signal receiving section receives the abnormal signal by one of radiowaves and infrared rays.

5. An abnormality detecting system as set forth in claim 2, wherein said electric equipment transmits the abnormal signal by one of radiowaves and infrared rays.

6. An abnormality detecting system as set forth in claim 1, wherein said abnormal signal successively indicates a plurality of abnormalities which occur in said electric equipment, at predetermined intervals.

7. An abnormal signal processing unit for analyzing an abnormal signal transmitted from electric equipment separate from said abnormal signal processing unit, the abnormal signal being indicative of the occurrence of an abnormality detected in the electric equipment, said abnormal signal processing unit comprising:

a signal receiving section for receiving the abnormal signal;

a memory section for storing predetermined data corresponding to abnormal signals received by said signal receiving section;

a judging section coupled to said signal receiving section and said memory section for extracting data corresponding to the abnormal signal from among the predetermined data stored in said memory section;

a displaying section coupled to the judging section for displaying thereon the data extracted by said judging section;

a manipulating section for inputting instructions for said abnormal signal processing unit; and a processing section coupled to said manipulating section for carrying out instructions from said manipulating section.

8. An abnormal signal processing unit as set forth in claim 7, further comprising an additional memory section coupled to said signal receiving section for storing the abnormal signal, and a signal transmitting section for transmitting the abnormal signal stored in said additional memory section to an external device.

9. An abnormal signal processing unit as set forth in claim 7, wherein said abnormal signal processing unit is formed in a shape which is portable.

10. An abnormal signal processing unit as set forth in claim 7, wherein said signal receiving section receives the abnormal signal by one of radiowaves and infrared rays in a non-contact manner.

11. An abnormal signal processing unit as set forth in claim 8, wherein the electric equipment transmits the abnormal signal by one of radiowaves and infrared rays in a non-contact manner.

* * * * *